United States Patent [19]

Learmont et al.

[11] Patent Number: 5,207,595

[45] Date of Patent: May 4, 1993

[54] WATTHOUR METER SOCKET ADAPTER WITH LOCKABLE TERMINAL COVER AND SEALING RING

[75] Inventors: Robert O. Learmont, Walled Lake; Darrell A. Robinson, Highland; Albert K. Langdon, Rochester Hills; Allen V. Pruehs, Howell; Robert Goozen, St. Clair, all of Mich.

[73] Assignee: Ekstrom Industries, Inc., Farmington Hills, Mich.

[21] Appl. No.: 826,804

[22] Filed: Jan. 28, 1992

[51] Int. Cl.$^5$ .............................................. H02B 1/00
[52] U.S. Cl. ................... 439/517; 361/370; 361/373
[58] Field of Search ............... 439/135, 146, 517, 718; 361/364, 369–373

[56] References Cited

U.S. PATENT DOCUMENTS

| | | | |
|---|---|---|---|
| 3,061,763 | 10/1962 | Ekstrom | 361/373 |
| 3,636,498 | 1/1972 | McQuarrie | 439/517 |
| 4,311,354 | 1/1982 | Robinson et al. | 361/371 |
| 4,772,213 | 9/1988 | Bell et al. | 439/135 |
| 4,823,572 | 4/1989 | Signorelli | 70/163 |
| 4,934,747 | 6/1990 | Langdon et al. | 292/256.67 |

*Primary Examiner*—Neil Abrams
*Attorney, Agent, or Firm*—Basile and Hanlon

[57] ABSTRACT

A terminal cover removably mountable on a watthour meter socket adapter includes an arm having an outwardly extending flange which is disposed in proximity with a sealing ring when the sealing ring is disposed about the mating mounting flange of a watthour meter and the rim of the socket adapter to lockingly mount the terminal cover on the socket adapter via the lock device carried by the sealing ring. In one embodiment, the flange on the arm has a predetermined length to engage a notch in the sealing ring to prevent rotation of the sealing ring. In another embodiment, the length of the flange on the arm is selected such that the flange lies between the sealing ring and the socket adapter housing to lockingly retain the terminal cover on the socket adapter housing when the sealing ring is locked about the mounting flange of the watthour meter and the rim of the socket adapter. In another embodiment, the terminal cover includes an outwardly extending filler portion which has an arcuate wall formed at an outer end. An annular flange and peripheral rim on the end of the arcuate wall forms a continuous extension of the annular flange and the rim on the side wall of the socket adapter housing. The terminal cover is locked in place on the socket adapter housing via the locking device used to lock the sealing ring about the socket adapter housing and the watthour meter.

19 Claims, 5 Drawing Sheets

WATTHOUR METER SOCKET ADAPTER WITH LOCKABLE TERMINAL COVER AND SEALING RING

BACKGROUND OF THE INVENTION

1. Field of the Invention

The present invention relates, in general, to watthour meters and, specifically, to watthour meter socket adapters for receiving plug-in watthour meters and, more specifically, to security devices for watthour meters.

2. Description of the Art

Electrical watthour meters have long been used to measure the amount of electrical power consumed by a particular machine or electrical utility customer. Watthour meters have been constructed in various configurations depending upon the type of electrical service that is required. Typically, watthour meters have a circular cross section meter mounting portion which is mounted on a wall or support surface of a building or residence. A watthour meter includes gages which indicate the amount of power consumed by the customers.

Older watthour meters of the so-called bottom connected type are formed of a single-piece housing in which the watthour meter is fixedly mounted along with terminals which provide connection between the building wiring and the external power distribution line conductors. Any defect in the watthour meter requires replacement of the entire housing. To overcome this problem, socket-type watthour meters have been devised in which the watthour meter plugs into an adapter or base having contacts connected to terminals to which the building wiring and the power line conductors are connected. This enables defective watthour meters to be easily replaced without requiring the removal of the entire housing and internal conductors.

Such socket adapters have a watthour meter receiving portion in the form of an annular side wall which extends outward from a planar base. The side wall terminates at the outer edge in a rim which mates with a corresponding mounting flange formed on the socket-type watthour meter. A sealing ring is placed about the mating rim and flange and locked in place by a suitable lock device and/or a locking tab which provides an indication of tampering.

Presently bottom connected to socket watthour meter adapters do not have a lower portion of the sealing rim. This discontinuity in the rim is provided to allow the manufacture of the housing as a single molded plastic part. Typically, this discontinuity is centered at the bottom of the rim and varies from 60° to 120°. Conventional sealing rings are required by industry standards to have a small gap for drainage where the ends of the sealing ring join together at the bottom of the adapter. If one skilled in the art of tampering is aware of the discontinuity in the ring, then by rotating the sealing ring so the gap in the sealing ring is at the discontinuity, by offsetting and further rotating the sealing ring, they can virtually unscrew the sealing ring and remove the watthour meter and the sealing ring as one unit without signs of tampering with the locking device.

A terminal block typically housing a plurality of screw-type terminals is mounted on the base of the bottom connected meter or socket adapter below the watthour meter receiving portion. A removable terminal cover is lockingly attached to the terminal block housing surrounding the terminal block by a suitable lock to prevent unauthorized access to the terminals. The terminal cover for bottom connected meters disclosed in U.S. Pat. No. 4,823,572 has a sealing bar which passes horizontally through a part of the cover from one side of the cover. The sealing bar has apertures which enable a seal tab to be installed to indicate tampering with the meter by inspecting the integrity of the seal. A lip is formed on one end of the sealing bar and is positioned to interfere with the rotation of the cover of the watthour meter when the cover is attached to a bottom-connected watthour meter. This prevents rotation of the meter cover and its possible unauthorized removal from the watthour meter while the terminal cover is in place.

FIG. 1 depicts a similar prior art terminal cover 10 for a watthour meter which includes a protrusion 12 integrally molded with the cover 10 and which extends inward from the cover 10 toward the base of the bottom connected watthour meter housing. The protrusion 12 engages a notch formed in the annular flange of the meter cover to prevent rotation of the meter cover. A receptacle 14 for a barrel-type lock is mounted on the terminal cover 10 for securely locking the terminal cover 10 in place to the bottom connected watthour meter housing. The protrusion provides a lock for the meter cover to concurrently lock the meter cover and the terminal cover in place.

While such security devices for lockingly mounting a terminal cover on a bottom connected watthour meter housing which include means for engaging the rotatable watthour meter cover to prevent rotation of the watthour meter cover are effective, such security devices for bottom connected to socket watthour meter adapters employ separate locks, one for the sealing ring and one for the terminal cover, for separate locking of the sealing ring and the terminal cover to the socket adapter. This adds additional cost to the socket adapter and typically may require different lock keys which complicates maintenance and authorized access to such meters by a utility company which may use several thousands of such meters.

Another prior art watthour meter socket adapter 190 is shown in FIG. 2. In this adapter 190, a discontinuity 192 was formed in the lower portion of the annular side wall and rim 194 of the adapter housing 196. A terminal cover 198 having an annular extension and rim 200 at one end was slidingly mounted in the terminal block 202 via a dovetail connection and was movable from a lowered position covering terminals 204 in the terminal block 202 to a raised position, shown in FIG. 2, to expose the terminals 204. When in the lowered position, the annular extension and rim 200 aligned with the side wall and rim 194 of the adapter housing 196 and filled the discontinuity 192 with only a small gap being formed between the sides of the annular extension and rim 200 and the adjacent edges of the side wall and rim 194 of the adapter housing 196. The sealing ring used to lock the watthour meter in the adapter 190 also engaged the annular extension and rim 200 of the terminal cover 198 to lock the terminal cover 198 in the lowered position overt he terminals 204. However, an installer was required to hold the terminal block 198 in the raised position to access the terminals 204. This made wiring connections to the terminals 204 difficult since one hand was needed to hold the terminal cover 198 in the raised position.

Thus, it would be desirable to provide a watthour meter adapter having an approved security device which can be constructed at a low cost and which securely locks the sealing ring and the terminal cover of the watthour meter adapter in place to prevent unauthorized access to the watthour meter and the terminal block. It would also be desirable to provide a security device for a watthour meter adapter which employs only one lock to securely and concurrently lock and retain the sealing ring and the removable terminal cover on the watthour meter adapter. It would further be desirable to eliminate the discontinuity in the meter sealing ring or provide a method to prevent the rotation of a sealing ring and concurrent removal of the sealing ring and watthour meter without signs of tampering.

SUMMARY OF THE INVENTION

The present invention is a watthour meter socket adapter having a lockable terminal cover and sealing ring in which the terminal cover is provided with sealing ring retaining means which lockingly mounts the terminal cover on the socket adapter via the sealing ring lock.

Preferably, sealing ring retaining means is mounted on or integrally formed on the terminal cover and engages the sealing ring or is disposed in underlying relationship with the sealing ring when the terminal cover is mounted on the terminal portion of the watthour meter socket adapter housing such that the terminal cover is non-removably attached to the socket adapter housing when the sealing ring is locked into place about the mounting flanges of the socket adapter housing and watthour meter.

In one embodiment, the retaining means comprises a plate fixedly connected to the terminal cover and having an outwardly extending arm portion. A flange is integrally formed with the arm portion and extends angularly therefrom so as to be disposed in proximity with the side wall of the socket adapter housing when the terminal cover is mounted on the housing. Preferably, a pair of spaced arm portions are mounted on the plate, each of the arms having a flange integrally formed on and extending therefrom.

This embodiment finds particular advantageous use when the sealing ring is provided with at least one and preferably a plurality of circumferentially spaced notches on an annular side flange. The flange or flanges on the retaining means on the terminal cover each engage one of the notches on the sealing ring when the sealing ring is mounted about the mounting flanges of the socket-type watthour meter and the socket adapter housing so as to lock the terminal cover in place on the socket adapter housing and, at the same time, to prevent rotation of the sealing ring which could enable unauthorized removal of the watthour meter from the socket adapter housing and access to the interior of the socket adapter housing.

In another embodiment, the arm and flange are integrally formed as a unitary part of the terminal cover. In this embodiment, the arm or arms, each having a flange integrally formed thereon, extends away from an upper lip portion of the terminal cover.

In a first embodiment, the length of the flange or flanges is selected so as to engage the notches in the sealing ring when the terminal cover and the sealing ring are mounted on the socket adapter housing. In another embodiment, the length of the flange or flanges on the arms is shorter so as to not engage the sealing ring, but is retainingly trapped between the sealing ring and the socket adapter housing. This alternate embodiment also lockingly mounts the terminal cover on the socket adapter housing through the lock means carried by the sealing ring.

In yet another embodiment, the socket adapter housing is provided with spaced side walls which extend integrally from the annular side wall portion forming the watthour meter receiving portion of the socket adapter housing. The side walls receive a terminal block. The terminal cover, in this embodiment, includes a filler portion which extends from the terminal cover portion mountable over the terminal block into proximity with the annular side wall of the socket adapter housing. An annular flange is mounted on the end of the filler portion and forms a continuous extension of the annular flange on the side wall of the socket adapter housing. When the sealing ring with an integral lock is mounted about the mounting flanges of the watthour meter and the socket adapter housing, the sealing ring encloses the annular flange of the filler portion on the terminal cover thereby lockingly mounting the terminal cover on the socket adapter housing without the need for a separate terminal cover lock.

In summary, the present invention provides a terminal cover for a watthour meter socket adapter which is lockingly retained on the socket adapter without need for a separate lock dedicated exclusively to the terminal cover. The terminal cover of the present invention is uniquely formed with a sealing ring retaining means which retains the terminal cover in place on the socket adapter housing when the sealing ring is mounted about the mating rim and mounting flange of the watthour meter and the socket adapter housing. Thus, only the conventional sealing ring lock need be employed to lock both the sealing ring and the terminal cover in place on the socket adapter housing. This results in a watthour meter socket adapter having a lower cost than previously constructed socket adapters since only a single lock means is employed for both the sealing ring and the terminal cover.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

The present invention is a socket-type watthour meter having a lockable terminal cover and a sealing ring in which the terminal cover and the sealing ring used to sealingly mount the socket-type watthour meter to a socket adapter are locked in place on the watthour meter socket adapter housing by a single lock means on the sealing ring.

Figure 3:
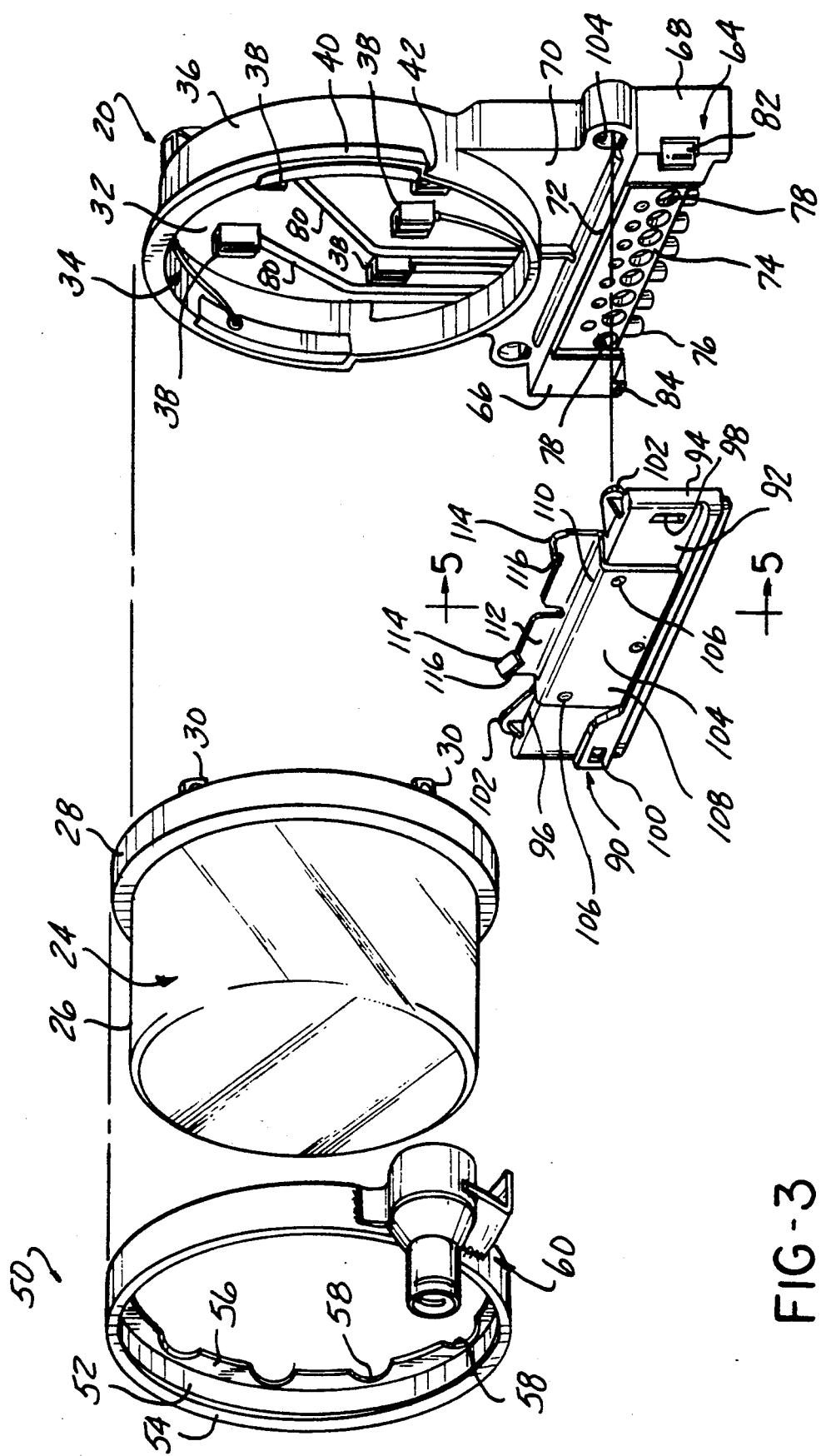
FIG. 3 is an exploded, perspective view of a watthour meter socket adapter, watthour meter and sealing ring having a terminal cover constructed in accordance with a first embodiment of the present invention mountable thereon.

By way of background, FIG. 3 depicts a conventional socket adapter 20 which receives a socket-type watthour meter 24 in a push-in connection. As is well known, the socket-type watthour meter 24 includes a cover 26 which encloses the internal mechanism and gages of the watthour meter 24. An annular mounting flange 28 extends radially outward from the base of the socket-type watthour meter 24 and provides a mounting connection to the socket adapter 20, as described hereafter. A plurality of blade terminals 30 also extend outward from the base of the watthour meter 24. The terminals 30 are provided in a predetermined number and arrangement depending upon the type of electrical service provided to a customer, i.e., single phase, three phase, etc.

The socket adapter 20 includes a housing having a generally planar base 32. A watthour meter receiving portion 34 is formed at one end of the base 32 and has an annular, peripheral side wall 36 extending outward from one surface of the base 32. The annular side wall 36 surrounds a plurality of jaw-type electrical contacts 38 which are fixedly mounted on the base 32. Such contacts 38 are conventional in construction and generally have a pair of spring-metal biased fingers which form a jaw for receiving one of the blade terminals 30 on the watthour meter 24 when the watthour meter 24 is brought into engagement with the socket adapter 34. The number and location of the contacts 38 is selected depending upon the type of electrical service to be provided to the customer, i.e., single phase, three phase, etc.

As shown in FIG. 3, the side wall 36 of the socket adapter housing terminates in a radially outward extending rim 40 which extends around a major extent of the watthour meter receiving portion 34. A discontinuity indicated by reference number 42 is formed at a portion of the flange 40 for ease in forming the socket adapter housing as a single piece molded part.

A sealing ring 50, also known as a clamp ring or collar, is provided for connecting the watthour meter 24 to the flange 40 of the watthour meter receiving portion 34 of the socket adapter 20. The sealing ring 50 is of special construction for high security applications, such as a sealing ring sold by E.J. Brooks Company, Model No. 8490010. The sealing ring 50 is in the form of an annular shaped band having a generally U-shaped cross section formed by a planar central portion 52 and two radially inward extending side flanges 54 and 56. The width of the central portion 52 of the sealing ring 50 is selected such that the spaced flanges 54 and 56 fit on opposite sides of the mating flange 28 of the watthour meter 24 and the rim 40 on the socket adapter housing 20. For reasons which will become more apparent hereafter, a plurality of spaced, preferably, scalloped-shaped notches 58 are formed in the flange 56 and circumferentially spaced about the sealing ring 50.

As is also conventional, the ends of the sealing ring 50 are urged into proximity with each other with a small gap therebetween. A receptacle for a lock device, such as a barrel-type lock 60, for example, is attached to one end of the sealing ring 50. The lock 60 locks the two ends of the sealing ring 50 together about the mating mounting flange 28 and the rim 40 of the watthour meter 24 and the socket adapter 20, respectively, to lockingly mount the watthour meter 24 to the socket adapter 20.

The watthour meter socket adapter 20 also includes a terminal portion denoted in general by reference number 64. The terminal portion 64 includes a pair of spaced side walls 66 and 68 which are formed as integral extensions of the side wall 36 of the watthour meter receiving portion 34 and extend downward below the watthour meter receiving portion 34. A solid filler portion 70 is integrally formed between the side wall 36, at the location of the discontinuity 42 and a top lip portion 72 of the terminal portion 64 and extends between the terminal portion side walls 66 and 68. The filler portion 70 is spaced from the base 32 of the socket adapter 20 thereby forming a slot through which a plurality of electrical conductors 80, described hereafter, pass.

A terminal block 74 is fixedly mounted on the base of the socket adapter housing in the terminal portion 6 between the side walls 66 and 68. As is conventional, the terminal block 74 includes a plurality of lugs 76 which have a hollow, through bore extending therethrough. A second set of bores 78 are also formed in the terminal block 74 and intersect respective ones of the bores extending through the lugs 76. Terminals are mounted at the intersection of each pair of bores 76 and 78 and receive screws which provide electrical connection between electrical utility power line conductors, not shown, inserted through the lugs 76 and the internal electrical conductors 80 extending from the terminals to the individual contacts 38 in the watthour meter receiving portion 34.

As is also conventional, a key 82 is mounted in the side wall 68 of the terminal portion 64 of the socket adapter 20. A corresponding hinge pin 84 is mounted on the other side wall 66 of the terminal portion 64. The key 82 and the hinge pin 84 provide a mounting connection for a removable terminal cover 90 to the terminal portion 64 of the socket adapter 20.

Figure 1:
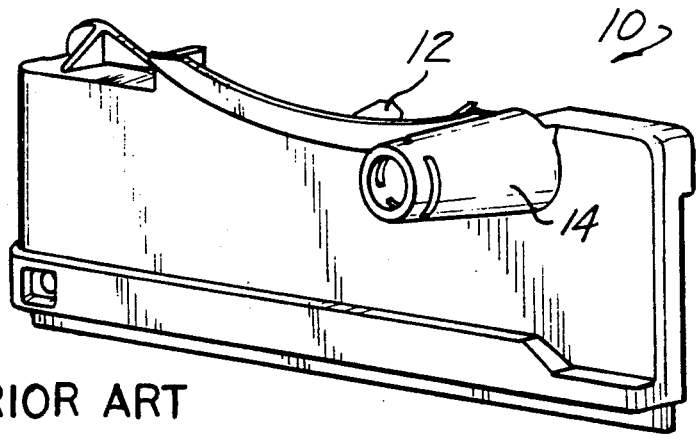
FIG. 1 is a perspective view of a prior art terminal cover.
Figure 4:
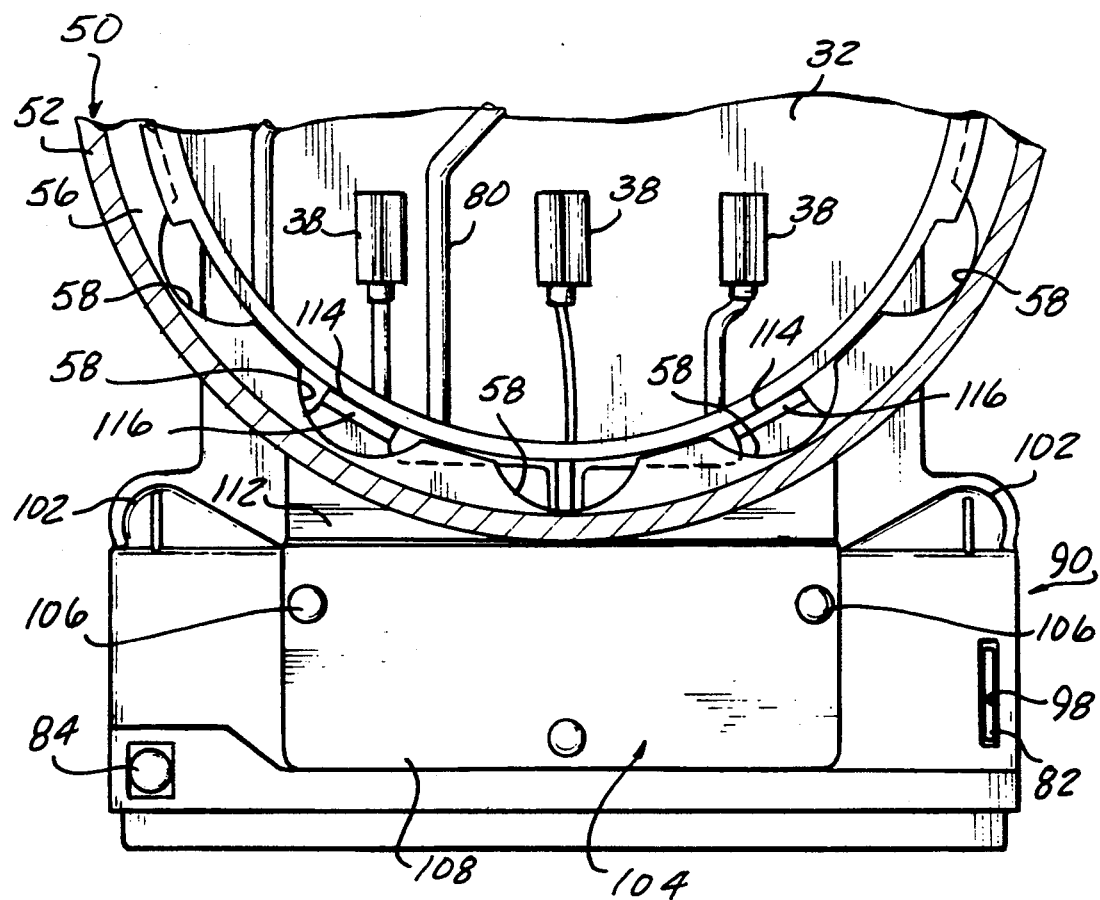
FIG. 4 is a front elevational view of the watthour meter socket adapter, sealing ring and terminal cover shown in FIG. 3, with the components disposed in their assembled position.
Figure 2:
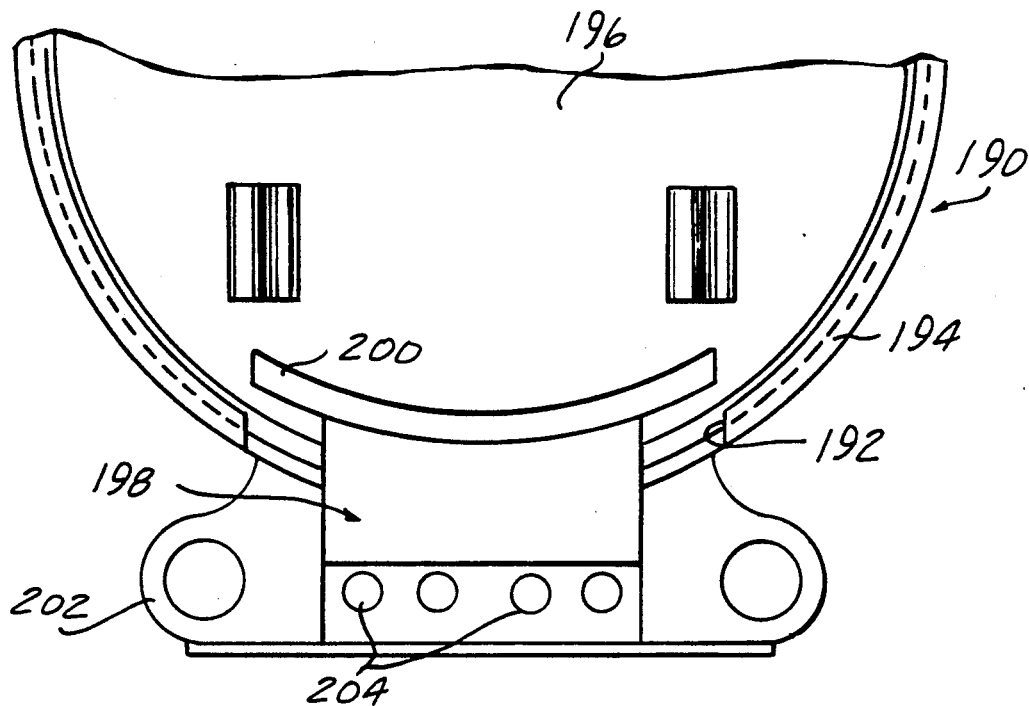
FIG. 2 is a front elevational view of another prior art watthour meter socket adapter having a slidable terminal cover mounted thereon.
Figure 5:
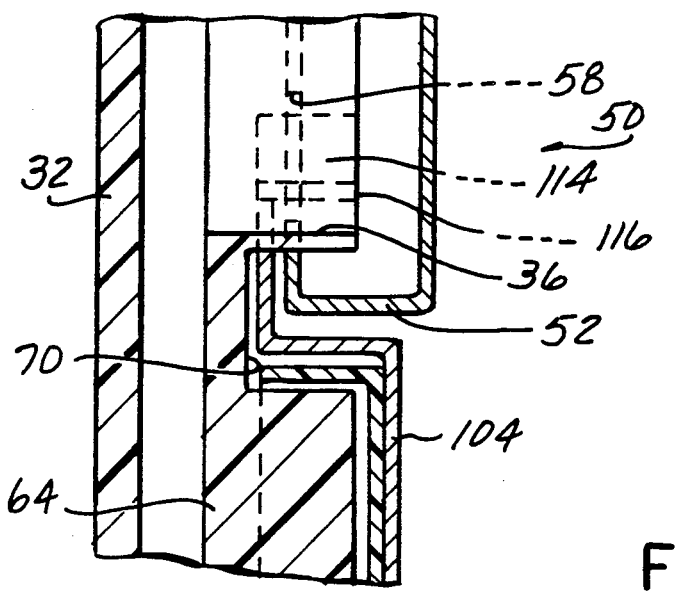
FIG. 5 is a partial, cross sectional view generally taken along line 5—5 in FIG. 3.

In a first embodiment shown in FIGS. 3, 4 and 5, the terminal cover 90 is designed to lockingly cover the terminal block 74 and prevent access to the terminals mounted therein. The terminal cover 90 includes a generally planar front wall 92 with inwardly facing side walls 94 and an inwardly facing top lip 96. A slot 98 is formed in the front wall 92 for receiving the key 82 therethrough. A clasp 100 is formed on an opposite side of the front wall 92 of the terminal cover 90 for receiving the hinge pin 84. The slot 98 and the clasp 100 cooperate with the key 82 and the hinge pin 84 to removably swing the terminal cover 90 in a door-like manner over the terminal portion 64 of the housing of the socket adapter 20. A pair of ears 102 are formed on the terminal cover 90 adjacent opposite edges of the top lip 96 for covering mounting bores 104 in the terminal portion 64 of the socket adapter 20 housing.

The terminal cover 90 of the present invention is uniquely provided with sealing ring retaining means which engages the sealing ring 50 when the terminal cover 90 and the sealing ring 50 are mounted on the socket adapter 20 to lock the terminal cover 90 on the socket adapter 20. The retaining means is in the form of a plate 104 which, in one embodiment, is a separate member fixedly mounted on the front wall 92 of the terminal cover 90 by means of suitable fasteners 106, such as rivets, etc. The plate 104, as shown in FIGS. 3 and 5, includes a bent arm portion having a first generally planar portion 108 which extends over the front wall 92 of the terminal cover 90. A second portion 110 extends substantially perpendicularly from the first portion 108 so as to overlie the top lip 96 of the terminal cover 90. A third arm portion 112 extends substantially perpendicularly from the second arm portion 10 and parallel with the first portion 108. At least one and preferably a pair of spaced flanges 114 extend perpendicularly from the third arm portion 112 in parallel over the second portion 110. The length of the third arm portion 112 is selected so that the flanges 114 are disposed in close proximity with the peripheral side wall 36 of the watthour meter receiving portion 34 of the socket adapter 20 when the terminal cover 90 is mounted on the socket adapter 20 housing. Further, the length of the flanges 114 from the third arm portion 112 is formed at a predetermined dimension so that the outer edge 116 of each flange 114 is in substantial alignment with the side wall 36 of the watthour meter socket adapter 20 at the location of the discontinuity 42 in the rim 40.

As shown in FIG. 3, each of the flanges 114 is disposed at an angle from the second portion 110 so as to be disposed in close proximity with the annular side wall 36 of the socket adapter 20.

Due to the above-described orientation and dimensional configuration of the flanges 114, the flanges 114 are each engageable with a different notch 58 in the sealing ring 50, as shown in FIG. 4, when the sealing ring 50 is brought into engagement about the mating flange 28 on the watthour meter and the rim 40 on the socket adapter 20. When the sealing ring 50 is locked in place via the lock means 60 on the sealing ring 50, the terminal cover 90 is simultaneous locked in place on the socket adapter 20. At the same time, the engagement of the flanges 114 in the terminal cover 90 with the spaced notches 58 in the sealing ring 50 prevents rotation of the sealing ring 50 which could enable unauthorized tampering with the watthour meter 24 by rotation of the sealing ring 50 and removal of the sealing ring 50 concurrently with the watthour meter 24 from the socket adapter 20.

Figure 6:
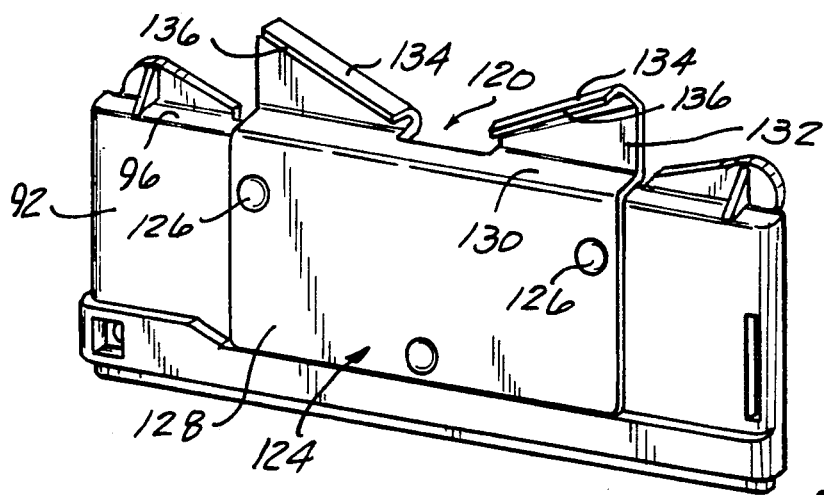
FIG. 6 is a perspective view of another embodiment of a terminal cover of the present invention.
Figure 7:
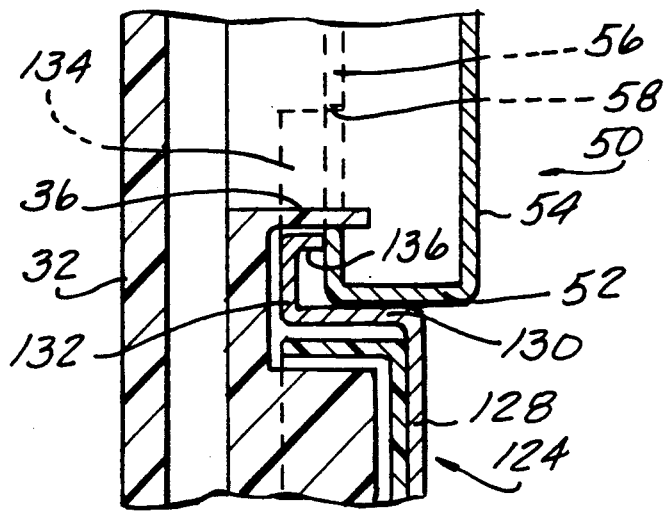
FIG. 7 is a partial, cross sectional view, generally similar to FIG. 5, but showing the mounting of the terminal cover depicted in FIG. 6 on the socket adapter shown in FIG. 3.

Another embodiment of the retaining means, as denoted by reference number 120 in FIGS. 6 and 7, can be mounted on a terminal cover, such as terminal cover 90 described above. Since the construction of the terminal cover in FIG. 6 is identical to that in FIG. 3, like reference numbers are employed for identical portions of the terminal cover. In this second embodiment, the engaging means 120 includes a plate having an arm portion 124 which is fixedly connected to the planar front wall 92 of the terminal cover by suitable fasteners. The arm portion 124 includes a first planar portion 128 overlaying the planar front wall 92 of the terminal cover. A second arm portion 130 extends perpendicularly from one end of the first portion 128 and overlies the top lip 96 of the terminal cover. A third arm portion 132 extends perpendicularly from the other end of the second arm portion 130. At least one and preferably a pair of spaced flanges 134 are formed on the ends of the third arm portions 132 and extend substantially perpendicular from the third arm portion 132 toward the first arm portion 128. The flanges 134 are disposed at an angle with respect to the second arm portion 130 so as to fit in close proximity with the annular side wall 36 of the watthour meter receiving portion 34 of the socket adapter 20. However, the length or extension of the flanges 134 is shorter than that of the flanges 114 shown in FIG. 3. In this manner, the flanges 134 are not engaged by the sealing ring 50 when the sealing ring 50 is mounted over the mating mounting flange 28 of the watthour meter 24 and the rim 40 of the socket adapter 20. However, the side wall flange 56 of the sealing ring 50 will overlie the outer edges 136 of the flanges 134 thereby retaining the terminal cover in place on the socket adapter 20 when the sealing ring 50 is locked about the mating mounting flange 28 and rim 40 as described above.

Figure 8:
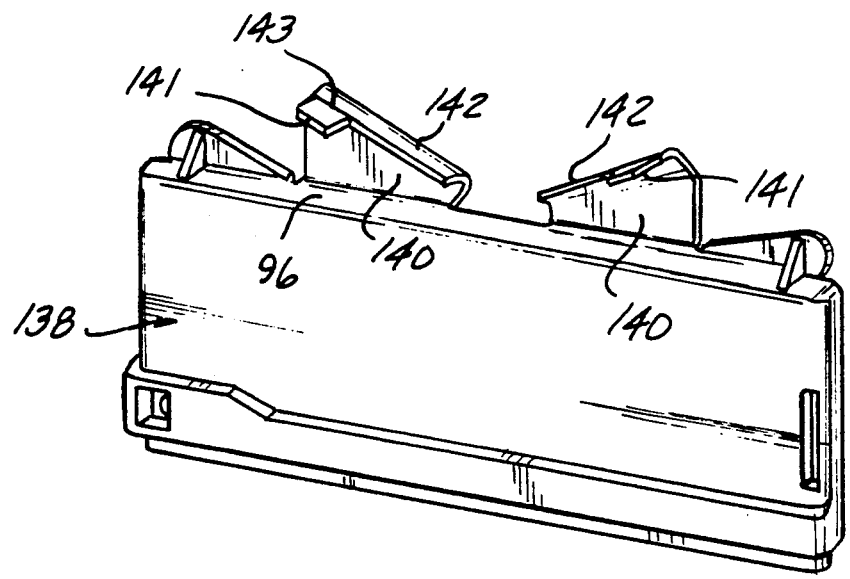
FIG. 8 is a perspective view of yet another embodiment of a terminal cover of the present invention.

As shown in FIG. 8, instead of a separate member or plate 104 or 124 used to form the retaining means, the retaining means may be integrally molded as a unitary part of the terminal cover 138. In this embodiment, arms 140 extend perpendicular from one edge of the top lip 96 of the terminal cover 138. At least one and, preferably, a pair of spaced flanges 142 extend perpendicularly from one end of each arm 140 toward the planar front wall of the terminal cover 138. The length and shape of the flanges 142 may be provided in either or both of the two configurations described above for the flanges 114 or 134 to provide engagement with or non-engagement but an overlapping relationship with the sealing ring 50.

FIG. 8 also illustrates a modification to the construction of the arms on the flanges formed on the terminal cover 138 which is equally applicable to the terminal covers shown in FIGS. 3 and 6. A tab 141 is formed on the ends of and extends outward from each flange 142. A weakened tear line 143 of reduced thickness is formed at the juncture of each tab 141 to a flange 142 to enable the tabs 141 to be broken off by tools or by hand. When the tabs 141 are removed, the flanges 142 function in the manner described above. The tabs 141, when left on the flanges 142, serve the same function as the longer flanges 114 shown in FIG. 3 and engage a notch 58 in the sealing ring 50. The removable tabs 141 may be formed on the plate 128 attached to the terminal cover 90 or as an integral part of the unitary arms 140, flanges 142 and terminal cover 138 as shown in FIG. 8.

Figure 10:
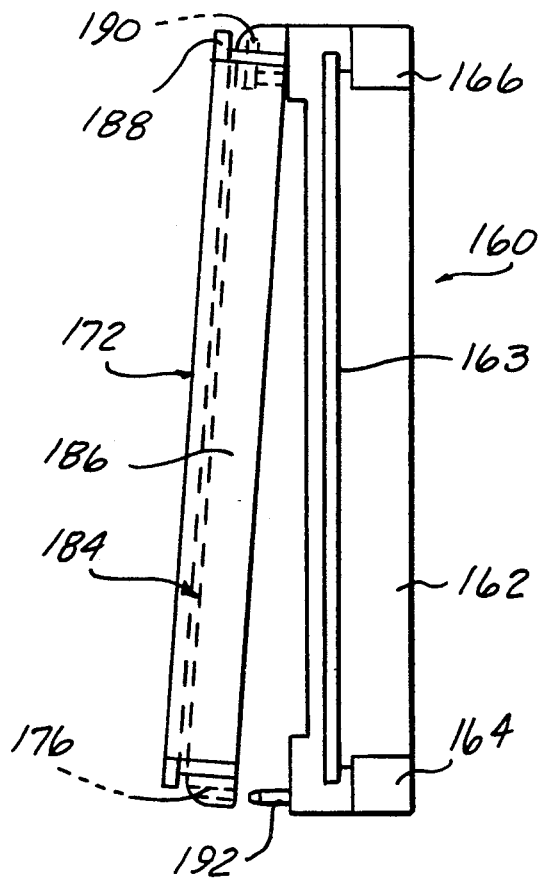
FIG. 10 is a plan view of the watthour meter socket adapter and terminal cover of FIG. 9 shown in an assembled position.
Figure 9:
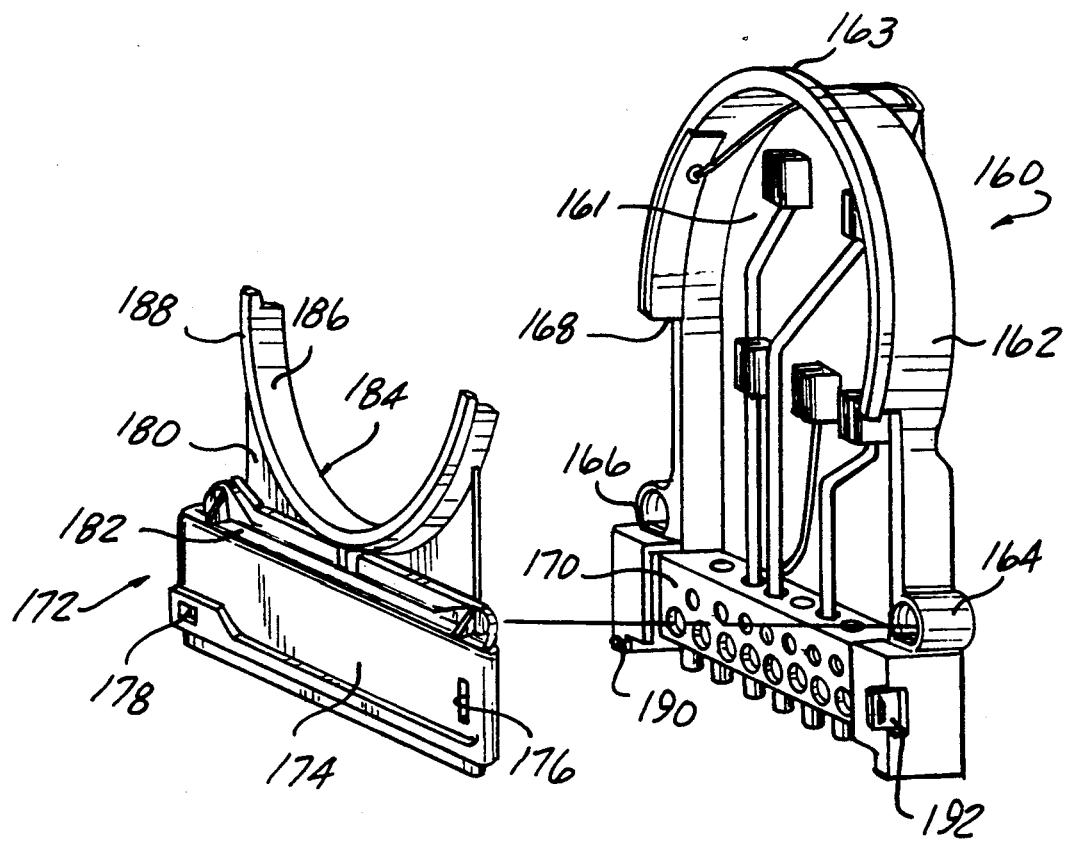
FIG. 9 is an exploded, perspective view showing another embodiment of a watthour meter socket adapter and terminal cover according to the present invention.

FIGS. 9 and 10 depict another embodiment of the present invention in which the watthour meter socket adapter 160 has a slightly different configuration from the socket adapter 20 shown in FIG. 3. In this embodiment, the socket adapter 160 has an annular side wall 162 forming a watthour meter receiving portion 161. A pair of spaced side wall extensions 164 and 166 extend from opposite sides of the peripheral side wall 162 and form a terminal receiving portion therebetween located below the watthour meter receiving portion 161.

In this embodiment, the entire space between the side wall extensions 164 and 166 is open from the base or back wall of the socket adapter 160. Further, a discontinuity, as shown by reference number 168, is formed in the annular side wall 162 and a peripheral rim 163 at a bottom portion spaced from the terminal receiving portion in which a terminal block 170 is mounted.

A unique terminal cover 172 is provided for not only covering the terminal block 170, but, also, for completing the discontinuity 168 in the annular side wall 162 and the rim 163 of the socket adapter 160. The terminal cover 172 includes a planar front wall 174 with a slot 176 and a clasp 178 which engage a hinge pin 190 and a key 192, respectively, on the socket adapter 160 to removably close the terminal cover 172 in a door-like manner as described above for FIG. 3.

In this embodiment, the terminal cover 172 includes a planar extension 180 which is integrally formed with the top lip 182. An annular portion 184 is integrally formed with the extension 180 and is dimensioned to fit within the discontinuity 168 and form a continuous extension of the annular side wall 162 and the rim 163 of the socket adapter 160 when the terminal cover 172 is mounted on the socket adapter 160. The annular portion 184 includes a side wall 186 similar in height and radius as the side wall 162 of the socket adapter 160. A semicircular rim 188 extends radially outward from the side wall 186 and aligns with and forms a continuous extension of the annular rim 163 on the socket adapter 160.

In this manner, when the terminal cover 172 is mounted on the socket adapter 160, the annular portion 184 formed on the side wall portion 186 and the rim 188 fills the discontinuity 168 in the socket adapter 160 and forms a continuous extension of the side wall 162 and the flange 163 on the socket adapter 160. The annular portion 184 and the rim 188 are dimensioned to fit in close proximity with the edges of the side wall 162 and the rim 163 of the socket adapter 160 at the discontinuity 168 to eliminate any gap between such edges. The joint between such edges can be a planar abutting joint or a stepped, overlapped joint.

Further, when a sealing ring, such as sealing ring 50, is mounted about the rim 163 on the socket adapter 160 and the corresponding mounting flange on the watthour meter mounted in the socket adapter 160, the sealing ring will lockingly retain the terminal cover 172 on the socket adapter 160 without the need for a separate terminal cover lock dedicated exclusively to the terminal cover 172.

In summary, there has been disclosed a unique watthour meter socket adapter with a terminal cover which is automatically locked in place on the socket adapter by the sealing ring disposable about the rim and the mounting flange of the socket adapter housing and the watthour meter. This eliminates the need for a separate terminal cover lock dedicated exclusively to the terminal cover which reduces the cost of the socket adapter; but still increases security. The terminal cover of the present invention, in one embodiment, also engages a high security sealing ring to prevent rotation of the sealing ring which could lead to unauthorized removal of the sealing ring and the watthour meter from the socket adapter. Further, in one embodiment, the terminal cover includes an annular side wall and a peripheral rim which fill the discontinuity in the socket adapter housing to prevent rotation and removal of the sealing ring and the watthour meter from the socket adapter.

What is claimed is:

1. A watthour meter socket adapter for use with a watthour meter having terminals and an annular mounting flange, the socket adapter comprising:
a housing, the housing including:
 a base;
 a watthour meter receiving portion having a peripheral side wall extending from the base and terminating in an outwardly extending, annular rim;
 a plurality of electrical contacts mounted on the base within the watthour meter receiving portion, each electrical contact receiving a terminal of the watthour meter in a snap-in connection;
 a terminal portion connected to and spaced from the watthour meter receiving portion;
 a plurality of electrical terminals mounted on the terminal portion;
 electrical conductors connected between the contacts in the watthour meter receiving portion and the terminals in the terminal portion;
 the terminals providing electrical connections between external electrical conductors extending into the terminal portion and the electrical conductors connected to the contacts;
a sealing ring lockingly mountable over the annular rim on the housing and the annular flange on the watthour meter to lock the watthour meter to the housing;
a single, unitary terminal cover removably attachable to the terminal portion of the housing for continuously covering the electrical connections of the terminals in the housing to the electrical conductors; and
means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing ring is lockingly mounted on the housing and the watthour meter.

2. The socket adapter of claim 1 wherein the retaining means comprises:
an arm connected to the terminal cover and extending outwardly therefrom; and
a flange joined to the arm and extending angularly therefrom.

3. The socket adapter of claim 2 further including a pair of spaced arms extending from the terminal cover, each arm having a flange extending thereon.

4. The socket adapter of claim 2 wherein the arm and flange are in the form of plate fixedly mounted to the terminal cover.

5. The socket adapter of claim 2 wherein the arm and flange are integrally formed as a unitary part of the terminal cover.

6. The socket adapter of claim 2 wherein the flange on the arm has a predetermined length such that the outer end of the flange is disposed in proximity with the sealing ring when the sealing ring and the terminal cover are mounted on the housing of the socket adapter, the flange disposed between the sealing ring and the housing to non-removably retain the terminal cover on the housing.

7. The socket adapter of claim 6 wherein the flange has a length substantially equal to the height of the side wall of the socket adapter housing.

8. The socket adapter of claim 7 wherein the annular rim of the socket adapter has a discontinuity located in proximity with the terminal portion of the housing of the socket adapter; and the flange on the arm on the terminal cover being disposed in proximity with the side wall of the socket adapter housing at the discontinuity.

9. A watthour meter socket adapter for use with a watthour meter having terminals and an annular mounting flange, the socket adapter comprising:

a housing, the housing including:
  a base;
  a watthour meter receiving portion having a peripheral side wall extending from the base and terminating in an outwardly extending, annular rim;
  a plurality of electrical contacts mounted on the base within the watthour meter receiving portion, each electrical contact receiving a terminal of the watthour meter in a snap-in connection;
  a terminal portion connected to and spaced from the watthour meter receiving portion;
  a plurality of electrical terminals mounted on the terminal portion;
  electrical conductors connected between the contacts in the watthour meter receiving portion and the terminals in the terminal portion;
a sealing ring lockingly mountable over the annular rim on the housing and the annular flange on the watthour meter to lock the watthour meter to the housing;
a terminal cover removably attachable to the terminal portion of the housing for covering the terminals in the housing; and
means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing rim is lockingly mounted on the housing and the watthour meter, the retaining means including:
  an arm connected to the terminal cover and extending outwardly therefrom; and
  a flange joined to the arm and extending angularly therefrom;
the sealing ring including an annular peripheral flange with at least one notch formed therein, the notch being engageable with the flange on the arm on the terminal cover when the sealing ring and the terminal cover are mounted on the housing of the socket adapter.

10. The socket adapter of claim 9 further comprising: a tab separably attached to and extending co-planarly from an outer end of the flange.

11. The socket adapter of claim 9 wherein the arm and flange are integrally formed as a unitary part of the terminal cover.

12. A watthour meter socket adapter for use with a watthour meter having terminals and an annular mounting flange, the socket adapter comprising:

a housing, the housing including:
  a base;
  a watthour meter receiving portion having a peripheral side wall extending from the base and terminating in an outwardly extending, annular rim;
  a plurality of electrical contacts mounted on the base within the watthour meter receiving portion, each electrical contact receiving a terminal of the watthour meter in a snap-in connection;
  a terminal portion connected to and spaced from the watthour meter receiving portion;
  a plurality of electrical terminals mounted on the terminal portion;
  electrical conductors connected between the contacts in the watthour meter receiving portion and the terminals in the terminal portion;
a sealing ring lockingly mountable over the annular rim on the housing and the annular flange on the watthour meter to lock the watthour meter to the housing;
a terminal cover removably attachable to the terminal portion of the housing for covering the terminals in the housing; and
means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing ring is lockingly mounted on the housing and the watthour meter, the retaining means including:
  a pair of spaced arms connected to and extending from the terminal cover, a flange joined to each arm and extending thereon;
the sealing ring including an annular peripheral flange having a plurality of notches formed therein, one notch being engageable with one flange when the sealing ring and the terminal cover are mounted on the housing of the socket adapter.

13. The socket adapter of claim 12 further comprising:
a tab separably attached to and extending co-planarly from an outer end of each flange.

14. The socket adapter of claim 12 wherein the arms and the flanges are integrally formed as a unitary part of the terminal cover.

15. A watthour meter socket adapter for use with a watthour meter having terminals and an annular mounting flange, the socket adapter comprising:

a housing, the housing including:
  a base;
  a watthour meter receiving portion having a peripheral side wall extending from the base and terminating in an outwardly extending, annular rim;
  a plurality of electrical contacts mounted on the base within the watthour meter receiving portion, each electrical contact receiving a terminal of the watthour meter in a snap-in connection;
  a terminal portion connected to and spaced from the watthour meter receiving portion;
  a plurality of electrical terminals mounted on the terminal portion;
  electrical conductors connected between the contacts in the watthour meter receiving portion and the terminals in the terminal portion;
a sealing ring lockingly mountable over the annular rim on the housing and the annular flange on the watthour meter to lock the watthour meter to the housing;
a terminal cover removably attachable to the terminal portion of the housing for covering the terminals in the housing; and
means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing ring is lockingly mounted on the housing and the watthour meter, the retaining means including:

an arm connected to the terminal cover and extending outwardly therefrom; and a flange joined to the arm and extending angularly therefrom;

the arm and flange being in the form of a plate fixedly mounted to the terminal cover;

the terminal cover having a front wall and a substantially perpendicular extending top surface;

the arm including:

a first portion overlaying the front wall of the terminal cover and joined thereto;

a second portion extending perpendicularly from the first portion and overlaying the top surface of the terminal cover; and a third portion extending perpendicularly from the second portion parallel to and away from the first portion, the flange extending angularly away from the end of the third portion.

16. A watthour meter socket adapter for use with a watthour meter having terminals and an annular mounting flange, the socket adapter comprising:

a housing, the housing including:

a base;

a watthour meter receiving portion having a peripheral side wall extending from the base and terminating in an outwardly extending, annular rim;

a plurality of electrical contacts mounted on the base within the watthour meter receiving portion, each electrical contact receiving a terminal of the watthour meter in a snap-in connection;

a terminal portion connected to and spaced from the watthour meter receiving portion;

a plurality of electrical terminals mounted on the terminal portion;

electrical conductors connected between the contacts in the watthour meter receiving portion and the terminals in the terminal portion;

a sealing ring lockingly mountable over the annular rim on the housing and the annular flange on the watthour meter to lock the watthour meter to the housing:

a terminal cover removably attachable to the terminal portion of the housing for covering the terminals in the housing; and means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing ring is lockingly mounted on the housing and the watthour meter, the retaining means including:

an arm connected to the terminal cover and extending outwardly therefrom;

a flange joined to the arm and extending angularly therefrom; and a tab separably attached to and extending co-planarly from an outer end of the flange.

17. A watthour meter socket adapter for use with a watthour meter having terminals and an annular mounting flange, the socket adapter comprising:

a housing, the housing including:

a base;

a watthour meter receiving portion having a peripheral side wall extending from the base and terminating in an outwardly extending, annular rim;

a plurality of electrical contacts mounted on the base within the watthour meter receiving portion, each electrical contact receiving a terminal of the watthour meter in a snap-in connection;

a terminal portion connected to and spaced from the watthour meter receiving portion;

a plurality of electrical terminals mounted on the terminal portion;

electrical conductors connected between the contacts in the watthour meter receiving portion and the terminals in the terminal portion;

a sealing ring lockingly mountable over the annular rim on the housing and the annular flange on the watthour meter to lock the watthour meter to the housing;

a terminal cover removably attachable to the terminal portion of the housing for covering the terminals in the housing; and means, mounted on the terminal cover and extending therefrom into proximity with the peripheral side wall of the watthour meter receiving portion and the sealing ring when the terminal cover is mounted on the terminal portion of the housing, for non-removably retaining the terminal cover on the housing when the sealing ring is lockingly mounted on the housing and the watthour meter, the retaining means including:

a pair of spaced arms connected to and extending from the terminal cover, a flange joined to each arm and extending therefrom; and a tab separably attached to and extending co-planarly from an outer end of each flange.

18. A watthour meter socket adapter for use with a watthour meter having terminals and an annular mounting flange, the socket adapter comprising:

a housing, the housing including:

a base;

a watthour meter receiving portion having an annular side wall extending from the base and terminating in an outwardly extending, annular rim, the annular side wall of the watthour meter receiving portion having a discontinuity formed at a predetermined portion thereof;

a pair of side walls extending from the side wall at opposite ends of the discontinuity to one end of the base of the housing;

a plurality of electrical contacts mounted on the base within the watthour meter receiving portion, each contact receiving a terminal of the watthour meter in a snap-in connection;

a terminal portion connected to the base between the pair of side walls;

a plurality of electrical terminals mounted on the terminal portion;

electrical conductors connected between the contacts in the watthour meter receiving portion and the terminals in the terminal portion, the terminals providing electrical connections between external electrical conductors extending into the terminal portion and the electrical conductors connected to the contacts;

a sealing ring lockingly mountable over the annular rim on the housing and the annular mounting flange on the watthour meter to lock the watthour meter to the housing;

a single, unitary terminal cover attachable to the terminal portion of the housing for continuously covering the electrical connections of the terminals in the housing to the electrical conductors;

the terminal cover having an integral, unitary filler portion extending from one end thereof;

an arcuate wall projecting from the end of the filler portion and forming a continuous extension of the annular side wall of the housing and substantially filling the discontinuity in the annular side wall when the terminal cover is mounted on the housing;

an outwardly extending annular rim formed on the arcuate wall of the terminal cover and forming a continuous extension of the annular rim on the annular side wall of the housing when the terminal cover is mounted on the housing; and a sealing ring lockingly mountable over the annular rim of the housing of the socket adapter, the annular mounting flange on the watthour meter and the annular rim of the terminal cover to lock the watthour meter and the terminal cover to the housing of the socket adapter.

19. A watthour meter socket adapter for use with a watthour meter having terminals and an annular mounting flange, the socket adapter comprising:

a housing, the housing including:

a base;

a watthour meter receiving portion having an annular side wall extending from the base and terminating in an outwardly extending, annular rim, the annular side wall of the watthour meter receiving portion having a discontinuity formed at a predetermined portion thereof;

a pair of side walls extending from the side wall at opposite ends of the discontinuity to one end of the base of the housing;

a plurality of electrical contacts mounted on the base within the watthour meter receiving portion, each contact receiving a terminal of the watthour meter in a snap-in connection;

a terminal portion connected to the base between the pair of side walls;

a plurality of electrical terminals mounted on the terminal portion;

electrical conductors connected between the contacts in the watthour meter receiving portion and the terminals in the terminal portion;

a sealing ring lockingly mountable over the annular rim on the housing and the annular mounting flange on the watthour meter to lock the watthour meter to the housing;

a terminal cover attachable to the terminal portion of the housing for covering the terminals in the housing;

the terminal cover having an integral, unitary filler portion extending from one end thereof;

means for swingably mounting the terminal cover to the terminal portion of the housing;

an arcuate wall projecting from the end of the filler portion and forming a continuous extension of the annular side wall of the housing and substantially filling the discontinuity in the annular side wall when the terminal cover is mounted on the housing;

an outwardly extending annular rim formed on the arcuate wall of the terminal cover and forming a continuous extension of the annular rim on the annular side wall of the housing when the terminal cover is mounted on the housing; and a sealing ring lockingly mountable over the annular rim of the housing of the socket adapter, the annular mounting flange on the watthour meter and the annular rim of the terminal cover to lock the watthour meter and the terminal cover to the housing of the socket adapter.

* * * * *